US006934430B2

United States Patent
Kim et al.

(10) Patent No.: US 6,934,430 B2
(45) Date of Patent: Aug. 23, 2005

(54) OPTICAL MODULE USED IN HIGH FREQUENCY BAND OPTICAL COMMUNICATION SYSTEM

(75) Inventors: Dong-wook Kim, Daejon (KR); In-ho Jeong, Daejon (KR); Choong-mo Nam, Daejon (KR)

(73) Assignee: Telephus Inc., Daejon (KR)

( * ) Notice: Subject to any disclaimer, the term of this patent is extended or adjusted under 35 U.S.C. 154(b) by 109 days.

(21) Appl. No.: 10/355,121

(22) Filed: Jan. 31, 2003

(65) Prior Publication Data

US 2003/0147592 A1 Aug. 7, 2003

Related U.S. Application Data

(60) Provisional application No. 60/353,255, filed on Feb. 4, 2002.

(51) Int. Cl.[7] .................................................. G02B 6/12
(52) U.S. Cl. .......................................... 385/14; 385/49
(58) Field of Search .................... 385/10–147; 359/342; 362/556; 372/46

(56) References Cited

U.S. PATENT DOCUMENTS 5,674,778 A * 10/1997 Lee et al. ...................... 438/24
5,976,953 A * 11/1999 Zavracky et al. ........... 438/455
5,987,202 A * 11/1999 Gruenwald et al. ........... 385/49
6,087,703 A * 7/2000 Ohta et al. ................... 257/461
6,148,512 A * 11/2000 Brown ......................... 29/837
6,332,719 B1 * 12/2001 Nishikawa et al. ........... 385/88

OTHER PUBLICATIONS

Young–sae Kwon and In–ho Jeong, "Coaxial Signal and Method of Manufacturing the Same", Dec. 21, 1999 Korean Patent Application.*

* cited by examiner

Primary Examiner—John D. Lee
Assistant Examiner—James D. Stein
(74) Attorney, Agent, or Firm—Rothwell, Figg, Ernst & Manbeck

(57) ABSTRACT

Provided are an optical module used in a high-frequency optical communication system, and an optical receiver module, an optical transmitter module, and an optical repeater module for receiving, transmitting, and repeating an optical signal in a high frequency band. The optical module includes a silicon substrate, the optical fiber, devices, a signal transmission line, and an oxidized porous silicon layer. In the silicon substrate, a V-shaped guide groove for arranging an optical fiber is formed. The optical fiber is installed in the V-shaped guide groove and used as a path through which an optical signal is input or output. The devices are mounted on the silicon substrate to receive, transmit, or repeat the optical signal. The signal transmission line electrically connects the devices. The oxidized porous silicon layer is formed at least between the silicon substrate and the devices to prevent signal loss.

2 Claims, 20 Drawing Sheets

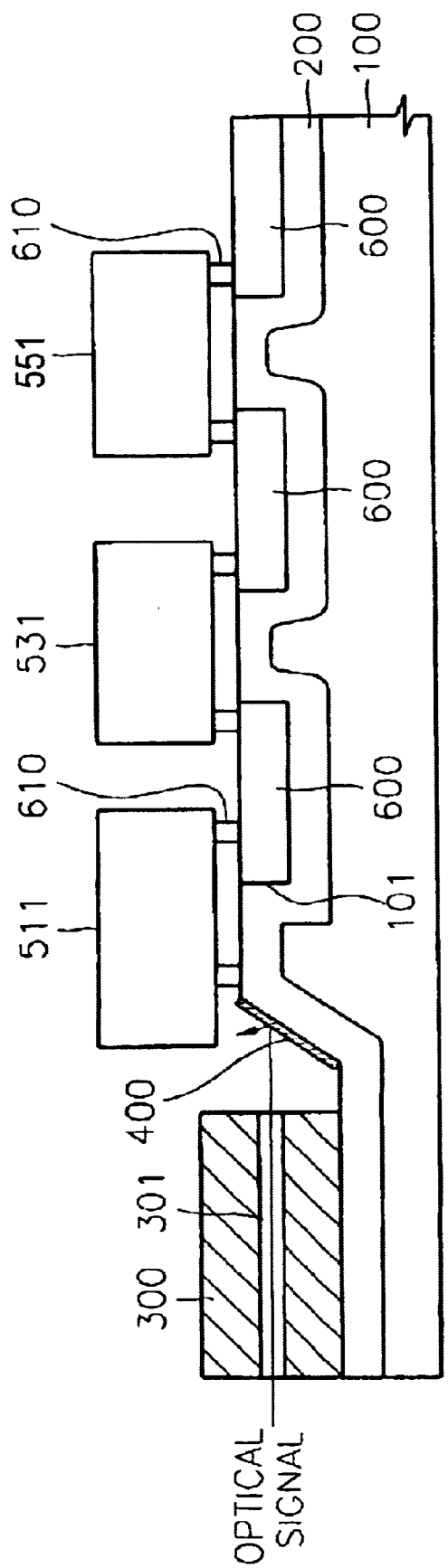

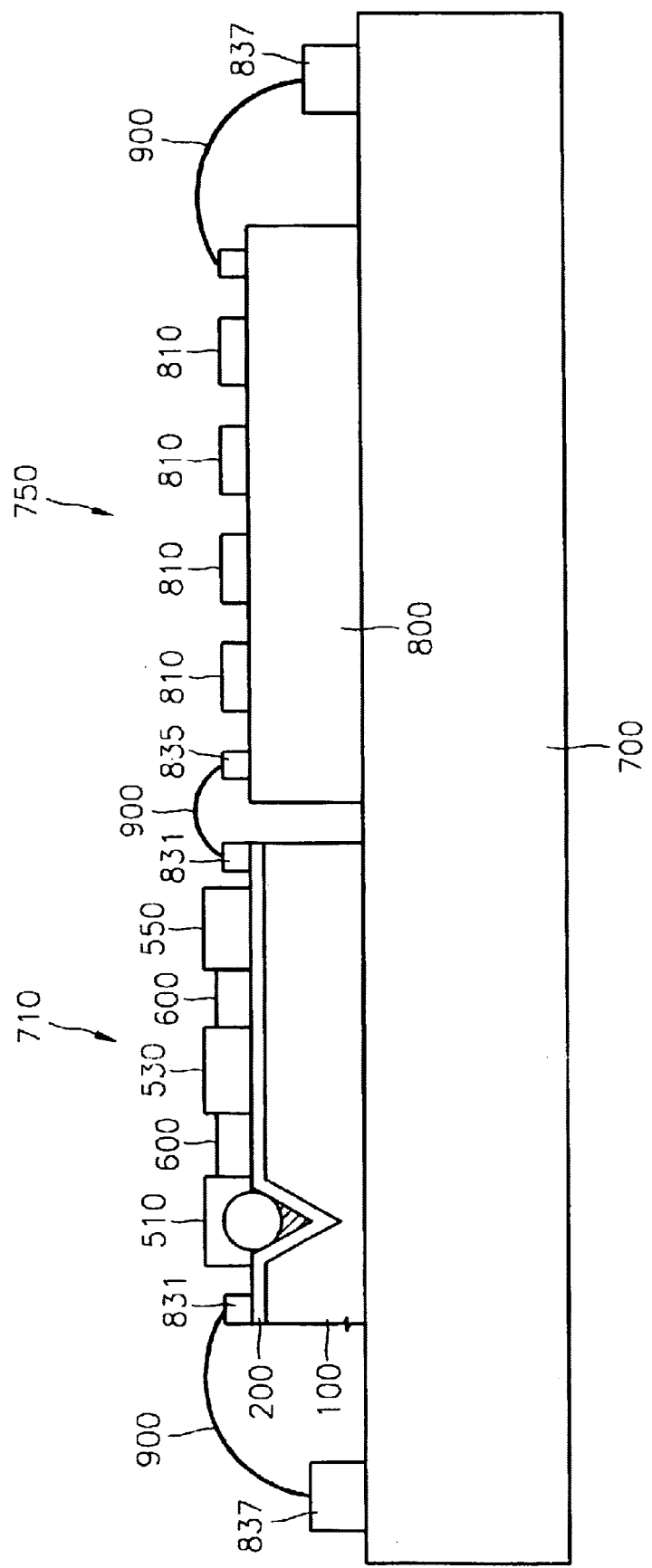

OPTICAL MODULE USED IN HIGH FREQUENCY BAND OPTICAL COMMUNICATION SYSTEM

CROSS-REFERENCE TO RELATED APPLICATIONS

This application claims the priority of U.S. Provisional Patent Application No. 60/353,255, filed Feb. 4, 2002, in the United States Patent and Trademark Office, the disclosure of which is incorporated herein in its entirety by reference.

BACKGROUND OF THE INVENTION

1. Field of the Invention

The present invention relates to an optical communication system, and more particularly, to an optical module, which is used to receive, transmit, or repeat an optical signal in a high frequency band, and an optical module system in which the optical module is integrated.

2. Description of the Related Art

In order to realize an optical module, elements necessary for realizing optical communications are integrated on a substrate. Such an optical module includes an optical receiver module used to receive an optical signal, an optical transmitter module used to transmit an optical signal, an optical repeater module used to repeat an optical signal, or the like. In particular, the optical receiver module receives an optical signal from an optical communication system, converts the optical signal into an electrical signal, and transmits the electrical signal to the communication system.

A conventional optical module, particularly an optical receiver module, is constituted by integrating various types of elements on a silicon substrate. However, within an increase in a communication frequency used in an optical communication, the use of such a silicon substrate reaches the limit. The reason is that the silicon substrate has a semiconducting characteristic, which causes an increase in loss of a signal.

Accordingly, in a high frequency, low-power consuming optical communication system, the use of an optical module employing such a silicon substrate is limited. An optical receiver module is realized by using a compound semiconductor substrate, such as GaAs, having less signal loss in a high frequency band, or a semiconductor substrate, such as SOI or SOS, instead of such a silicon substrate. SOI or SOS is developed to reduce signal loss by interposing an additional insulating layer between a substrate and elements integrated on the substrate to reduce the effect of the semiconductivity of silicon. However, since these substrates are much expensive than a silicon substrate, the realization of an optical module using these substrates has a high cost.

In actual, even when a silicon substrate is used, a silicon oxide ($SiO_2$) is interposed between the silicon substrate and elements integrated on the silicon substrate. Since the silicon oxide has a low dielectric constant, the silicon oxide is suitable for being used in an optical module in a high frequency band. Nevertheless, the use of the silicon substrate in the optical module in a high frequency band is restricted since the silicon oxide is formed to a thickness much thinner than a desired thickness on the silicon substrate.

In order to reduce signal loss in a high frequency band, the silicon oxide has to have a thickness of about several tens of micrometers. However, the thickness of an oxide layer grown on the silicon substrate by oxidation does not come to the desired thickness.

In general, a silicon oxide layer is formed on a silicon substrate by penetrating oxygen into the surface of the silicon substrate, i.e., performing an oxidation process, and converting a silicon layer into a silicon oxide layer. However, as the thickness of the silicon oxide layer increases with the growth thereof, oxygen cannot further penetrate into silicon. In other words, oxygen is trapped in the silicon oxide layer and does not penetrate into silicon under the silicon oxide layer any more. Due to this, when the thickness of the silicon oxide layer reaches 10 $\mu$m, it comes to a saturated point. Thus, the thickness of the silicon oxide layer is not increased any more.

As described above, it is difficult to thickly form a silicon oxide layer on a silicon substrate. Thus, it is difficult to employ the silicon substrate in an optical module using light in a high frequency band to realize the optical module.

SUMMARY OF THE INVENTION

Accordingly, the present invention provides an optical module in which elements for processing an optical signal are integrated on a silicon substrate by forming a thick silicon oxide layer on the silicon substrate.

According to an aspect of the present invention, there is provided an optical module used in a high-frequency optical communication system. The optical module includes a silicon substrate, the optical fiber, devices, a signal transmission line, and an oxidized porous silicon layer. In the silicon substrate, a V-shaped guide groove for arranging an optical fiber is formed. The optical fiber is installed in the V-shaped guide groove and used as a path through which an optical signal is input or output. The devices are mounted on the silicon substrate to receive, transmit, or repeat the optical signal. The signal transmission line electrically connects the devices. The oxidized porous silicon layer is formed at least between the silicon substrate and the devices to prevent signal loss.

According to another aspect of the present invention, there is also provided an optical receiver module used in a high-frequency optical communication system. The optical receiver module includes a silicon substrate, the optical fiber, an oxidized porous silicon layer, a photo detector, a current-voltage converter, a signal oscillator, and a signal transmission line. In the silicon substrate, a V-shaped guide groove for arranging an optical fiber is formed. The optical fiber is installed in the V-shaped guide groove and used as a path through which an optical signal is input. The oxidized porous silicon layer is formed in the silicon substrate to prevent signal loss. The photo detector is installed on the oxidized porous silicon layer, receives the optical signal input via the optical fiber, and converts the optical signal into a current signal. The current-voltage converter is installed on the oxidized porous silicon layer and converts the current signal into a voltage signal. The signal oscillator is installed on the oxidized porous silicon layer and generates a signal from the voltage signal. The signal transmission line electrically connects the photo detector, the current-voltage converter, and the signal oscillator.

Here, the photo detector, the current-voltage converter, or the photo detector is electrically connected to the signal transmission line via a solder bumper or a solder ball.

The optical receiver module further includes a metal mirror that is formed inside the V-shaped guide groove to change the path of the optical signal so that the optical signal input via the optical fiber is incident on the photo detector.

According to still another aspect of the present invention, there is also provided an optical transmitter module used in a high-frequency optical communication system. The optical transmitter module includes a silicon substrate, the optical fiber, an oxidized porous silicon layer, a laser diode, a drive amplifier, and a signal transmission line. In the silicon substrate, a V-shaped guide groove for arranging an optical fiber is formed. The optical fiber is installed in the V-shaped guide groove and used as a path through which an optical signal is output. The oxidized porous silicon layer is formed on the silicon substrate to prevent signal loss. The laser diode is installed on the oxidized porous silicon layer and generates the optical signal output via the optical fiber. The drive amplifier is installed on the oxidized porous silicon layer and drives the laser diode. The signal transmission line electrically connects the laser diode and the driver amplifier.

The optical transmitter module further includes a monitoring passive device that is installed behind the laser diode and monitors the optical signal generated by the laser diode.

According to yet another aspect of the present invention, there is also provided an optical repeater module used in a high-frequency optical communication system. The optical repeater module includes a silicon substrate, the first optical fiber, the second optical fiber, an oxidized porous silicon layer, a photo detector, a current-voltage converter, a signal oscillator, a laser diode, a driver amplifier, and a signal transmission line. In the silicon substrate, first and second V-shaped guide grooves for arranging first and second optical fibers are formed. The first optical fiber is installed in the first V-shaped guide groove and used as a path through which an optical signal is input. The second optical fiber is installed in the second V-shaped guide groove and used as a path through which the optical signal is output. The oxidized porous silicon layer is formed on the silicon substrate to prevent signal loss. The photo detector is installed on the oxidized porous silicon layer, receives the optical signal input via the first optical fiber, and converts the optical signal into a current signal. The current-voltage converter is installed on the oxidized porous silicon layer and converts the current signal into a voltage signal. The signal oscillator is installed on the oxidized porous silicon layer and generates a signal from the voltage signal. The laser diode is installed on the oxidized porous silicon layer and generates the optical signal output via the second optical fiber. The driver amplifier is installed on the oxidized porous silicon layer and drives the laser diode using the voltage signal generated by the current-voltage converter or the signal generated by the signal oscillator. The signal transmission line electrically connects the photo detector, the current-voltage converter, the signal oscillator, the driver amplifier, and the laser diode.

According to still yet another aspect of the present invention, there is also provided an optical receiver module system in which an optical receiver module and an active circuit are integrated on a circuit board. For example, the optical receiver module system may include the circuit board, the optical receiver module that is placed on the circuit board so as to be electrically connected to the circuit board, and the active circuit that is electrically connected to the circuit board and the optical receiver module.

Here, the active circuit and the optical receiver module may be electrically connected using a wire bonding method.

The active circuit and the optical receiver module may be electrically connected using a flip chip bonding method. Here, the optical receiver module flip-chip-bonded to the active circuit may be electrically connected to the circuit board using a flip chip bonding method. The optical receiver module may be electrically connected to the circuit board using a wire bonding method.

Here, the oxidized porous silicon layer may extend onto the V-shaped guide groove. The oxidized porous silicon layer may extend under the signal transmission line.

The optical receiver module may further include an inter-layered insulating layer that is formed on the oxidized porous silicon layer. The inter-layered insulating layer may include a silicon nitride layer.

The signal transmission line may include a main signal transmission line that electrically connects the devices and a ground line that encloses the main signal transmission line to prevent signal loss. Here, the signal transmission line has a coaxial structure where the ground line and the main signal transmission line have the same coaxial direction.

According to the present invention, by forming a thick oxidized porous silicon layer on a silicon substrate, signal loss, which may occur when installing devices for processing an optical signal in a high frequency band on the silicon substrate, can be minimized.

BRIEF DESCRIPTION OF THE DRAWINGS

The above features and advantages of the present invention will become more apparent by describing in detail exemplary embodiments thereof with reference to the attached drawings in which:

FIG. 3 is a schematic cross-sectional view for explaining an optical receiver module according to a third embodiment of the present invention;

FIG. 9 is a schematic cross-sectional view for explaining an optical receiver module, according to a ninth embodiment of the present invention, which integrated on a circuit board;

DETAILED DESCRIPTION OF THE INVENTION

Figure 1A:
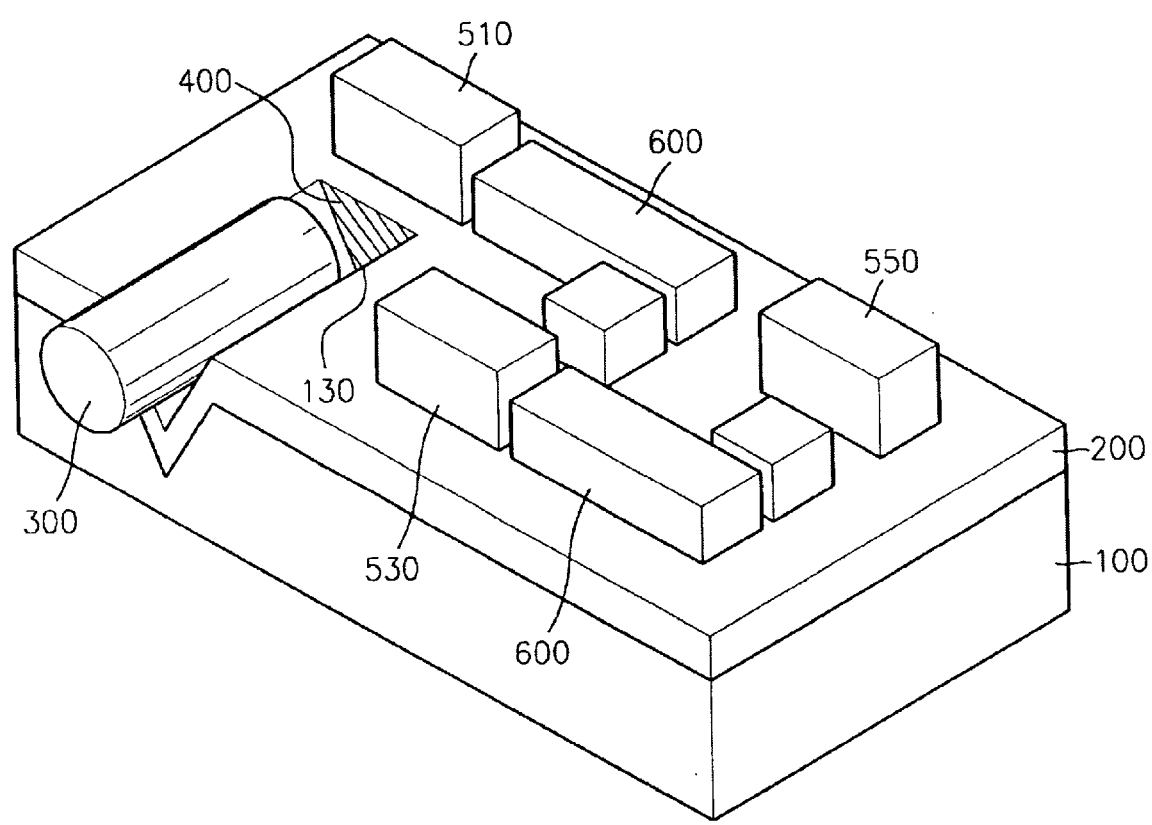
FIGS. 1A through 1C are schematic views for explaining an optical receiver module according to a first embodiment of the present invention.

Hereinafter, embodiments of the present invention will be described in detail with reference to the attached drawings. However, the embodiments of the present invention can be modified into various other forms, and the scope of the present invention must not be interpreted as being restricted to the embodiments. The embodiments are provided to more completely explain the present invention to those skilled in the art. In the drawings, the thicknesses of layers or regions are exaggerated for clarity. Like reference numerals in the drawings denote the same members. Also, when it is written that a layer is formed "on" another layer or a substrate, the layer can be formed directly on the other layer or the substrate, or other layers can intervene therebetween.

In embodiments of the present invention, an optical receiver module, an optical transmitter module, and an optical repeater module suitable for an optical communication system using light in a high frequency are integrated on a silicon substrate. Here, a thick oxidized porous silicon layer is interposed between the silicon substrate and elements that are integrated on the silicon substrate to realize modules on the silicon substrate. The thick oxidized porous silicon layer is formed to a thickness of several tens of micrometers.

The thick oxidized porous silicon layer has a relatively low relative dielectric constant and low dielectric loss similar to that of a general silicon oxide layer. An oxidized porous silicon layer may also be formed to a thickness much thicker than that of the general silicon oxide layer, e.g., to a thickness of several tens of micrometers. Thus, by interposing such an oxidize porous silicon layer between a silicon substrate and elements, when light in a high frequency band is used in an optical communication system, signal loss can be minimized. Also, an optical module suitable for a high frequency band can be realized by using a silicon substrate cheaper than a high-priced substrate, such as SOI, SOS, or GaAs.

In order to form a thick oxidized porous silicon layer on a silicon oxide layer, the surface of the silicon substrate is made porous to from a porous silicon oxide layer on the surface of the silicon substrate and then oxidizing the porous silicon layer. The thick oxidized porous silicon layer may be selectively formed on the silicon substrate.

First Embodiment

Figure 1B:
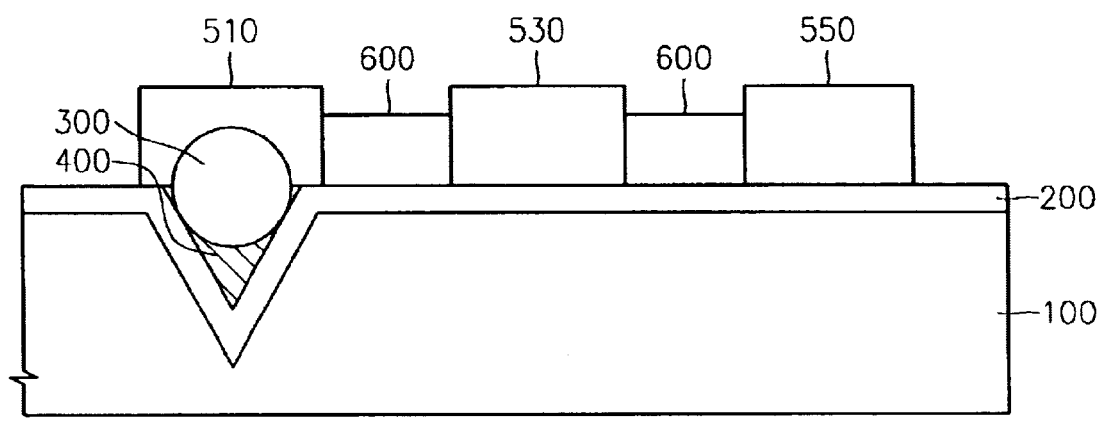
Figure 1C:
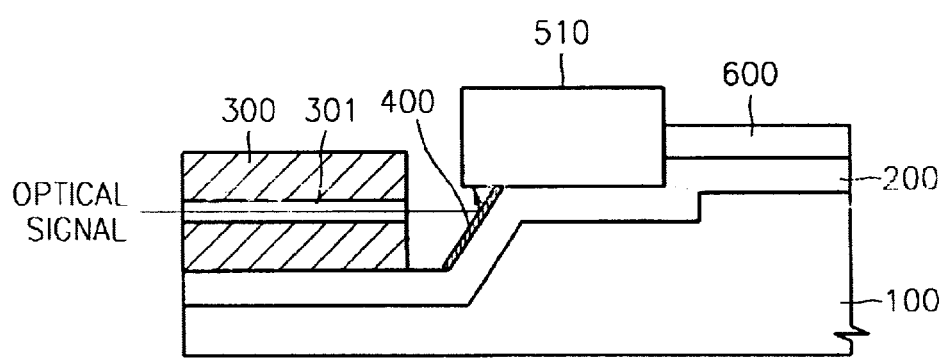

FIGS. 1A through 1C are schematic views for explaining an optical receiver module according to a first embodiment of the present invention.

FIG. 1A is a schematic perspective view of an optical receiver module according to a first embodiment of the present invention, FIG. 1B is a vertical cross-sectional view of the optical receiver module shown in FIG. 1A, and FIG. 1C is a schematic cross-sectional view for explaining a process of receiving light using the optical receiver module shown in FIG. 1A.

Referring to FIGS. 1A through 1C, in the optical receiver module according to the first embodiment of the present invention, various types of elements for receiving an optical signal, e.g., a photo detector 510, a current-voltage converter, e.g., a trans impedance amplifier (TIA) 530, and a signal generator, e.g., a voltage controlled oscillator (VCO) 550, are integrated on a silicon substrate 100, e.g., a $p^+$ conductive type silicon substrate. As shown in FIG. 1B, these elements are interconnected via a signal transmission line 600. The elements serve to transmit an optical signal incident on the optical receive module as an electrical signal, such as current, a voltage, or the like, to an optical system employing the optical receiver module.

For example, the photo detector 510 serves to receive an optical signal, which is incident on the optical receiver module via an optical fiber 300, and generates current. A guide groove 130 in which the optical fiber 300 is placed is formed in the surface of the silicon substrate 100 so that the optical fiber 300 transmits the optical signal to the photo detector 510. The guide groove 130 is V-shaped and at an angle of about 70.52°.

The optical fiber 300 is placed in the guide groove 130 to be used in the optical receiver module and transmits the optical signal to the photo detector 510. For this, as shown in FIG. 1C, a mirror 400 is slantingly formed at the end of the guide groove 130. The mirror 400 serves to change a path of the optical signal so that the optical signal incident on the mirror 400 through a transmission path 301 of the optical fiber 300 is incident on the photo detector 510.

The photo detector 510 serves to converts the optical signal into a current signal. In other words, the photo detector 510 receives the optical signal to generate current. As shown in FIG. 1B, when the current signal is transmitted to the TIA 530 through the signal transmission line 600, the TIA 530 amplifies the current signal to a voltage signal. When the voltage signal is transmitted to the VCO 550 through the signal transmission line 600, the VCO 550 generates a signal.

An oxidized porous silicon layer 200 is formed to a very thick thickness, e.g., to a thickness of about several tens of micrometers, between the elements constituting the optical receiver module, e.g., the photo detector 510, the TIA 530, the VCO 550, and the signal transmission line 600, and the silicon substrate 100.

The oxidized porous silicon layer 200 has a relatively low dielectric constant and a very thick thickness, e.g., a thickness of several tens of micrometers, to prevent signal loss. Thus, even when the optical signal is in a high frequency band, signal loss can be minimized by fully preventing signal loss due to the silicon substrate 100. As a result, it is possible to realize the optical receive module, which will be used in a high frequency band, at a low cost.

The signal transmission line 600 may have a coaxial structure. The signal transmission line 600 with the coaxial structure includes a main signal transmission line, which transmits a signal, and a ground line, which encloses the main signal transmission line to prevent signal interference. In other words, the main signal transmission line and the ground line are positioned in a coaxial direction. This will be described in detail later.

As shown in FIG. 1B, the elements, e.g., the photo detector 510, the TIA 530, and the VCO 550, may be formed directly on the silicon substrate 100. However, some of the elements may be separately manufactured and connected to the signal transmission line 600 via a connector, such as a solder bumper, a solder ball, or the like.

Second Embodiment

In the present embodiment, some elements are separately manufactured and connected to a signal transmission line. The same elements of the present embodiment as those of the first embodiments may be assigned the same reference numerals as those of the first embodiment.

Figure 2:
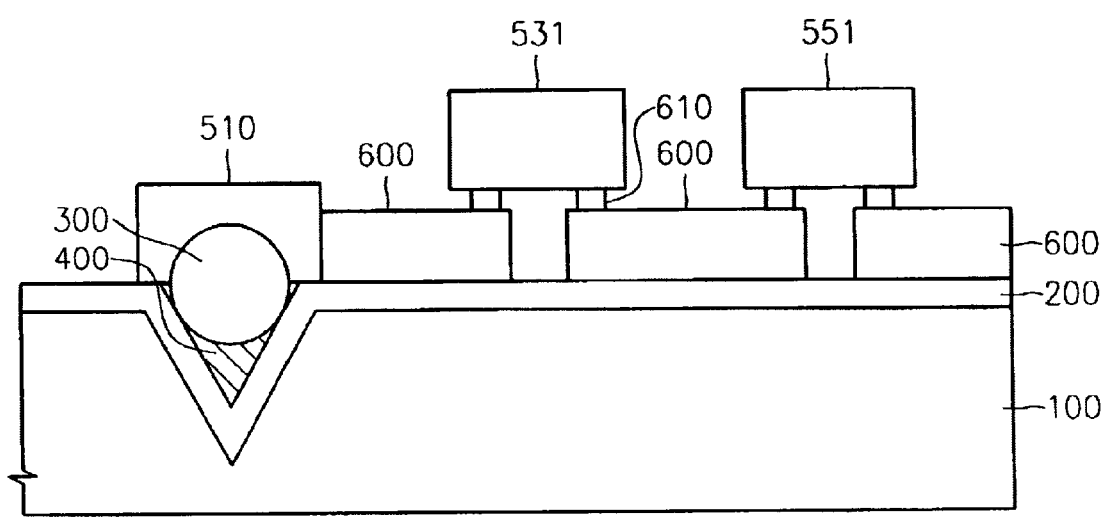
FIG. 2 is a schematic cross-sectional view for explaining an optical receiver module according to a second embodiment of the present invention.

FIG. 2 is a schematic cross-sectional view for explaining an optical receiver module according to a second embodiment of the present invention. Referring to FIG. 2, a transmission line 600 is directly formed on a silicon substrate 100 on which an oxidized porous silicon layer 200 is formed. Elements constituting the optical receiver module, e.g., a TIA 531 and a VCO 551, are separately manufactured and connected to the transmission line 600 using a flip chip bonding method. Here, the signal transmission line 600 and the elements, e.g., the TIA 531 and the VCO 551, are interconnected via a first connector 610 such as a solder bumper, a solder ball, or the like.

Third Embodiment

In the third embodiment, elements are connected to a signal transmission line via a connector using a flip chip bonding method. The same elements of the third embodiment as those of the first and second embodiments may be assigned the same reference numerals as those of the first and second embodiments.

FIG. 3 is a schematic cross-sectional view for explaining an optical receiver module according to a third embodiment of the present invention. Referring to FIG. 3, a signal transmission line 600 is directly formed on a silicon substrate 100 on which an oxidized porous silicon layer 200 is formed. Here, the signal transmission line 600 may be placed in a trench 101 that is formed in the surface of the silicon substrate 100. Placing the signal transmission line 600 in the trench 101 is advantageous to the realization of the previously described coaxial structure. The signal transmission line 600 having the coaxial structure includes a ground line that surrounds a main signal transmission line, which is a path for transmitting a signal. Forming the trench 101 is more advantageous in the realization of the ground line having the same axis as the main transmission line. This will be described in detail later. It is preferable that the trench 101 is formed before the oxidized porous silicon layer 200 is formed.

Elements constituting the optical receiver module, e.g., a photo detector 511, a TIA 531, and a VCO 551, are separately manufactured and connected to the signal transmission line 600 using a flip chip bonding method. Here, the signal transmission line 600 and the elements, e.g., the photo detector 511, the TIA 531, and the VCO 551, are interconnected via a first connector 610.

Fourth Embodiment

In the fourth embodiment, an inter-layered insulating layer is formed on a thick oxidized porous silicon layer. The same elements of the fourth embodiment as those of the first embodiment may be assigned the same reference numerals as those of the first embodiment.

Figure 4A:
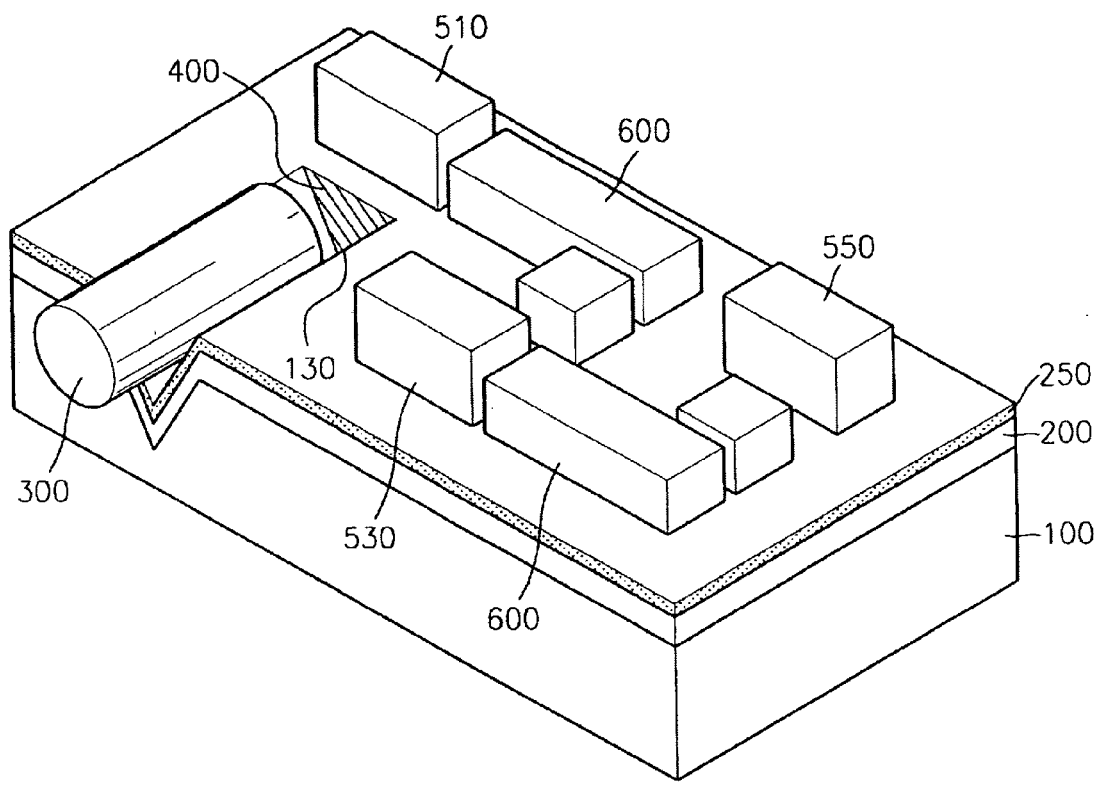
FIGS. 4A and 4B are schematic views for explaining an optical receiver module according to a fourth embodiment of the present invention.
Figure 4B:
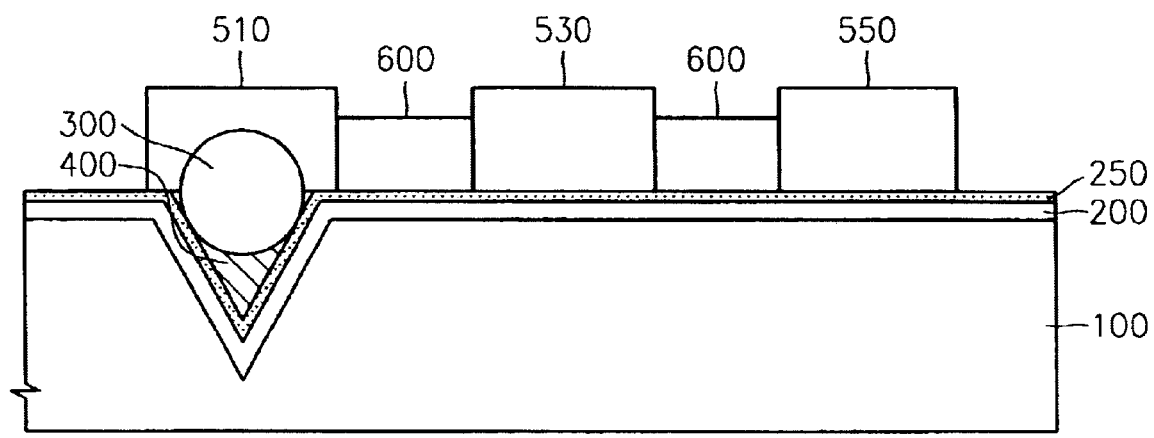

FIGS. 4A and 4B are schematic views for explaining an optical receiver module according to a fourth embodiment of the present invention.

FIG. 4A is a schematic perspective view of the optical receiver module according to the fourth embodiment of the present invention, and FIG. 4B is a schematic vertical cross-sectional view of the optical receiver module shown in FIG. 4A.

Referring to FIGS. 4A and 4B, in the optical receiver module according to the fourth embodiment of the present invention, a thick oxidized porous silicon layer 200 is formed on a silicon substrate 100. Next, an inter-layered insulating layer 250 is formed on the thick oxidized porous silicon layer 200. The inter-layered insulating layer 250 contributes to the minimizing signal loss caused by the silicon substrate 100.

The inter-layered insulating layer 250 may be formed of a silicon nitride (SiN) layer. Alternatively, the inter-layered insulating layer 250 may be formed of an insulator such as BCB, polyimide, TEOS silicon oxide, SOG, USG, BSG, BPSG, or the like.

On the silicon substrate 100 on which the thick oxidized porous silicon layer 200 and the inter-layered insulating layer 250 are formed, various types of elements for receiving an optical signal, e.g., a photo detector 510, a current-voltage converter, e.g., a TIA 530, and a signal generator, e.g., a VCO 550, are integrated. As shown in FIG. 4B, the elements are interconnected via a signal transmission line. The elements serve to transmit an optical signal incident on the optical receiver module as an electrical signal such as a current signal or a voltage signal to an optical communication system using the optical receiver module. An optical fiber 300 for receiving the optical signal is embedded in a V-shaped guide groove 130.

Fifth Embodiment

In the fifth embodiment, an inter-layered insulating layer is formed on a thick oxidized porous silicon layer, and elements are separately manufactured and connected to a signal transmission line. The same elements of the fifth embodiment as those of the fourth embodiment may be assigned the same reference numerals as those of the fourth embodiment.

Figure 5:
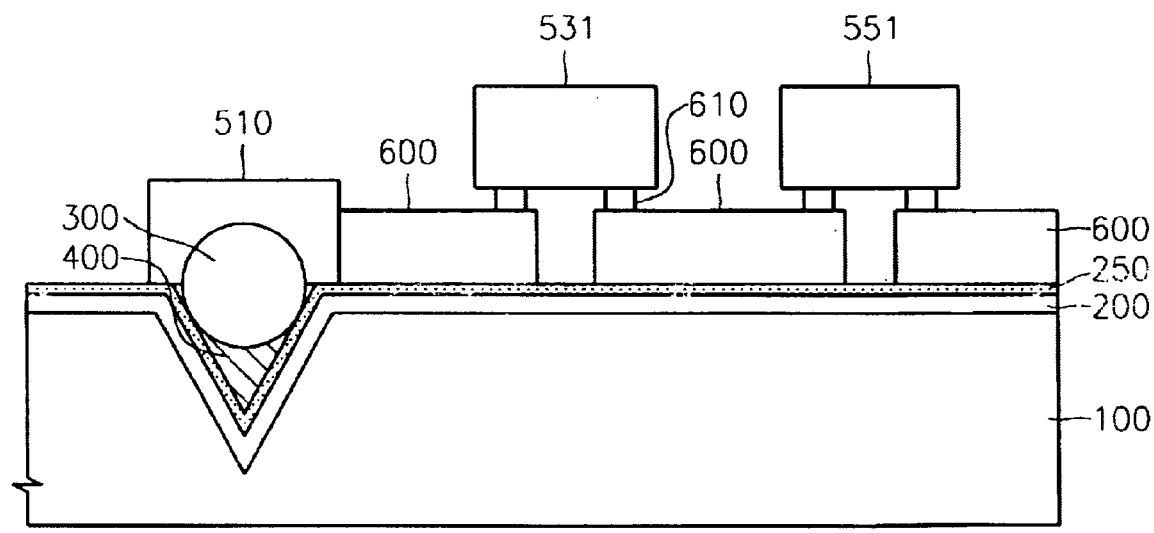
FIG. 5 is a schematic cross-sectional view for explaining an optical receiver module according to a fifth embodiment of the present invention.

FIG. 5 is a schematic cross-sectional view for explaining an optical receiver module according to a fifth embodiment of the present invention. Referring to FIG. 5, a signal transmission line 600 is directly formed on a silicon substrate 100 on which an oxidized porous silicon layer 200 and an inter-layered insulating layer 250 are formed. Elements constituting the optical receive module, e.g., a TIA 531 and a VCO 551, are separately manufactured and connected to the signal transmission line 600 using a flip chip bonding method. Here, the signal transmission line 600 and the elements, e.g., the TIA 531 and the VCO 551, are interconnected via a first connector such as a solder bumper or a solder ball. A photo detector 510 may also be manufactured as a separate chip and connected to the signal transmission line 600 using the flip chip bonding method.

Sixth Embodiment

The sixth embodiment suggests a signal transmission line having a coaxial structure used in embodiments of the present invention.

Figure 6A:
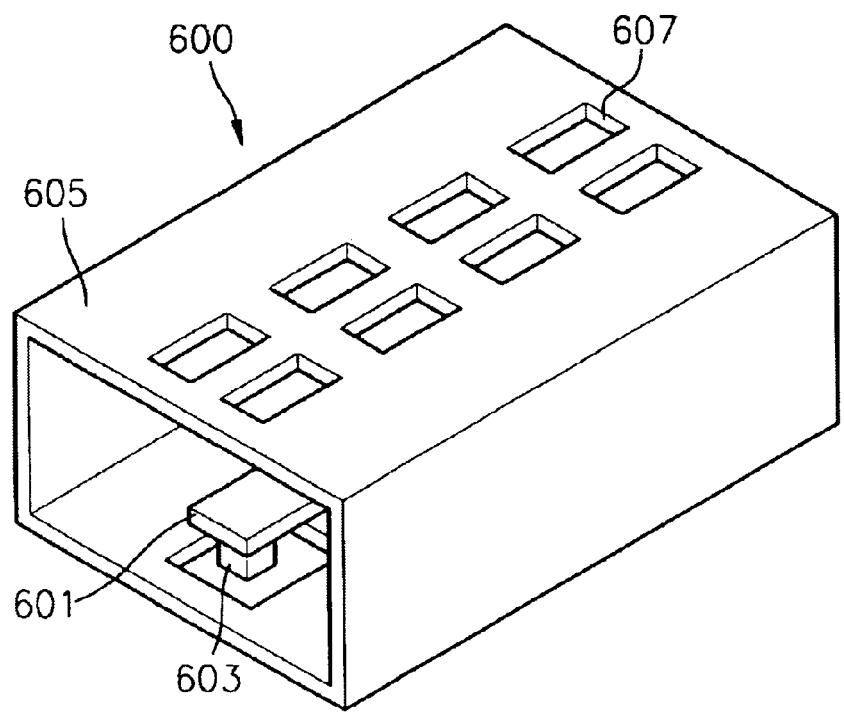
FIGS. 6A through 6E are schematic views for explaining a transmission line used in an optical receiver module according to a sixth embodiment of the present invention.
Figure 6B:
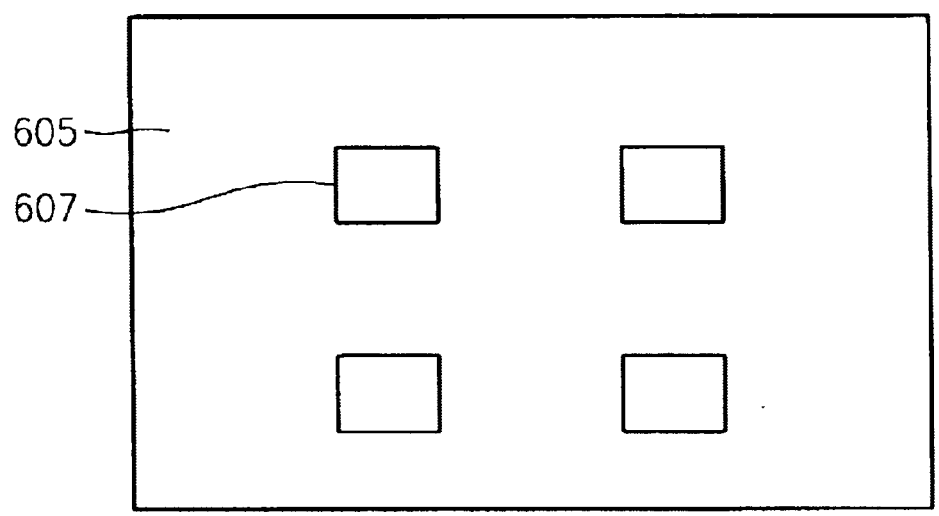
Figure 6C:
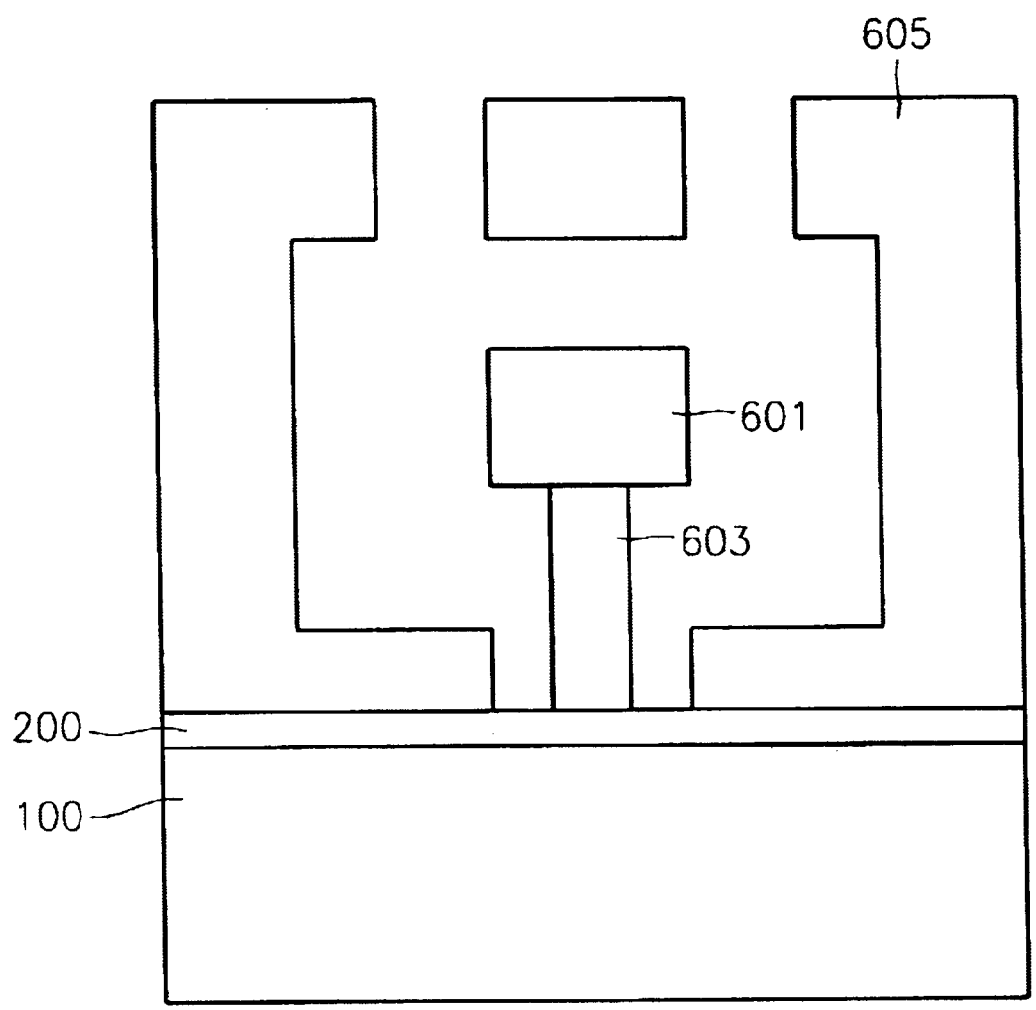
Figure 6D:
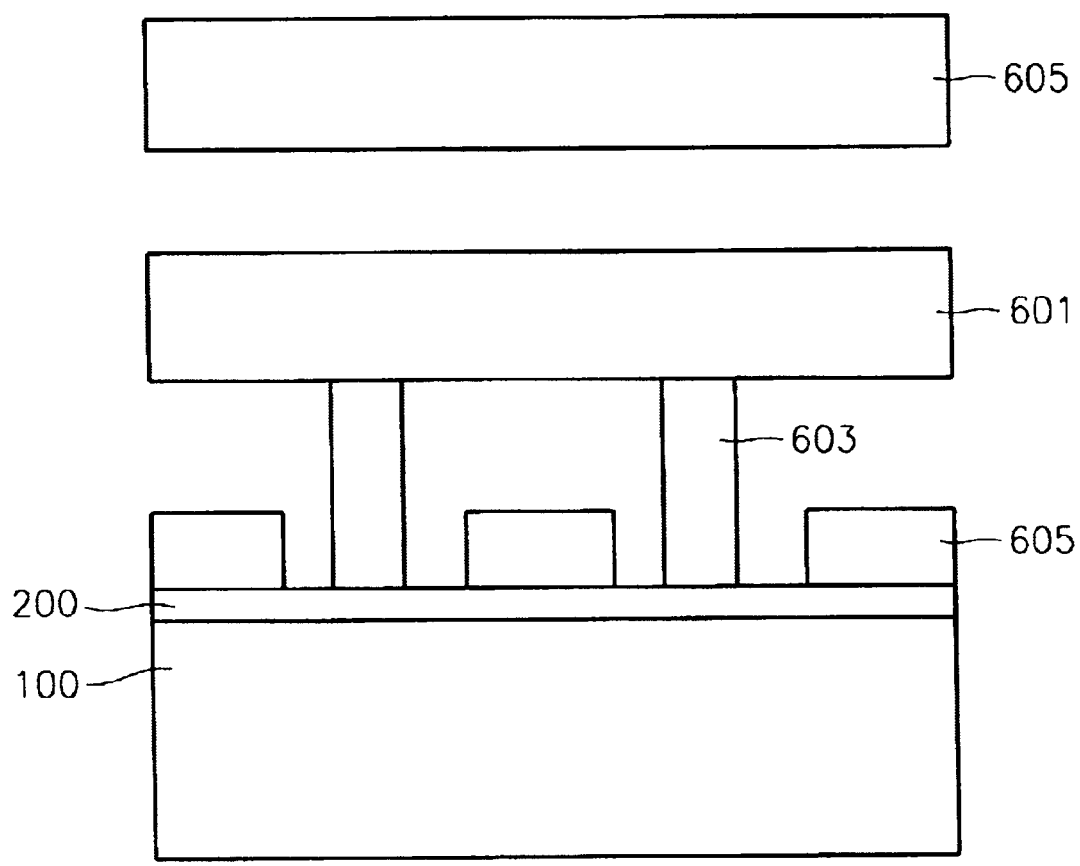
Figure 6E:
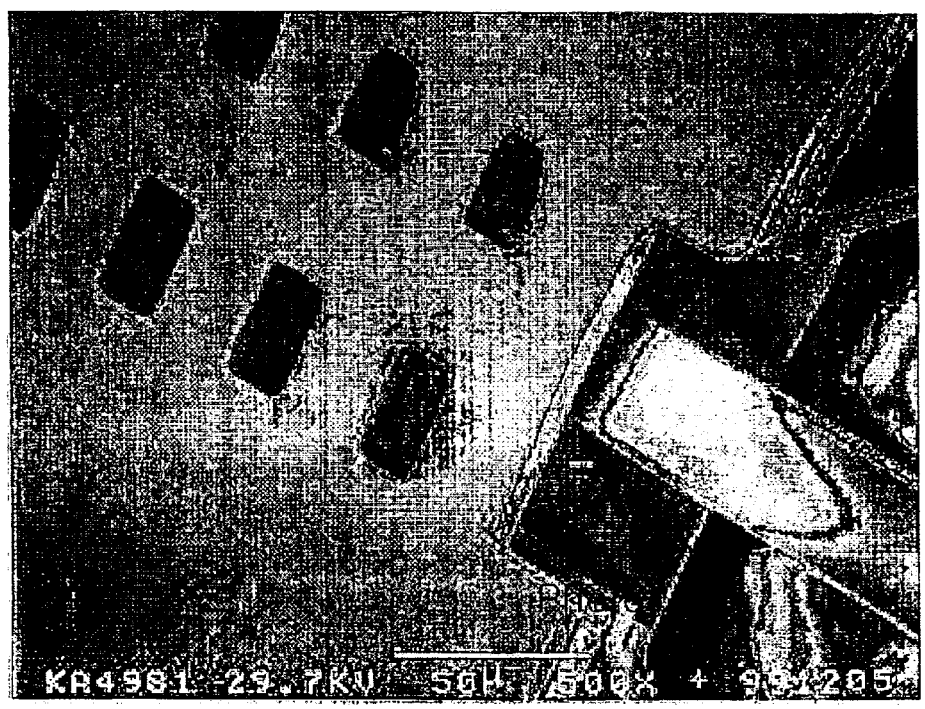

FIGS. 6A through 6D are schematic views illustrating a signal transmission line used in an optical module according to an embodiment of the present invention, and FIG. 6E is a scanning electron microscope (SEM) illustrating an actual appearance of the signal transmission line used in the optical receiver module according to the embodiment of the present invention.

Referring to FIGS. 6A through 6D, a signal transmission line 600 is constituted so that a main signal transmission line 601 for transmitting a signal floats over a silicon substrate 100 via a support 603. A ground line 605 encloses the main signal transmission line 601, which extends in the coaxial direction. The ground line 605 and the main signal transmission line 601 are formed of a conductive material, and the support 603 may be formed of insulation. In a case where the ground line 605 and the main signal transmission line 601 are formed of a metallic material, the metallic material is performed using a plating method. The support 603 may be formed of a conductive material or if necessary, may be formed an of insulation.

A method of the signal transmission line 600 having the coaxial structure is disclosed in Korean Patent Application No. 10-1999-0059866, entitled "Coaxial Signal Line and Method of Manufacturing the same" filed on Dec. 21, 1999 by the inventors, Young-sae Kwon and In-ho Jeong.

In order to form the signal transmission line 600 having the coaxial structure, a plurality of sacrificial insulating layers and metal layers among the plurality of sacrificial insulating layers may be formed by repeating a process of forming a sacrificial insulating layer, e.g., a photoresist layer, patterning the sacrificial insulating layer using a photolithographic process or the like, and forming a metal layer on the sacrificial insulating layer using a plating method, and then the sacrificial insulating layers may be selectively removed. Here, openings 607 for removing the sacrificial insulating layers may be formed in an optimum portion of the ground line 605. In addition, a path (not shown) for the connection of a first connector, e.g., the first connector 610 shown in FIG. 3, may be formed to interconnect the main signal transmission line 601 and the elements.

As presented in FIG. 3, the coaxial structure of the signal transmission line 600 may be realized in the trench 101 formed in the silicon substrate 100.

The actual appearance of the signal transmission line 600 having the coaxial structure is cubical as shown in the SEM of FIG. 6E.

Seventh Embodiment

In the seventh embodiment, a process of manufacturing an optical receiver module according to an embodiment of the present invention will be described. The same elements of the seventh embodiment as those of the first or second embodiment may be assigned the same reference numerals as those of the first or second embodiment.

Figure 7A:
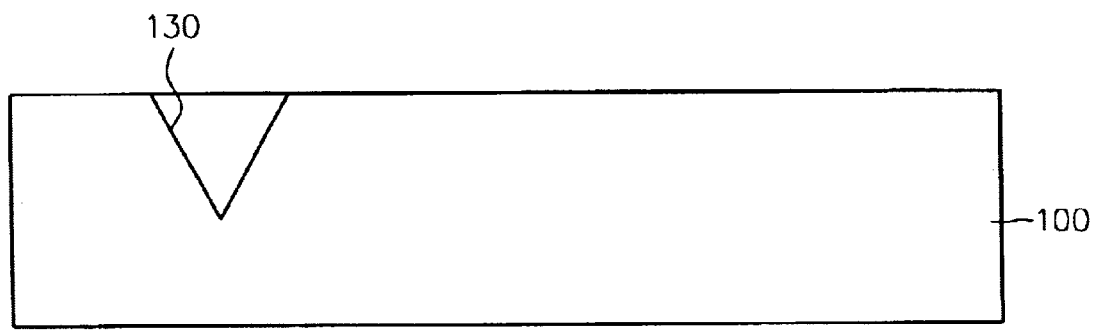
FIGS. 7A through 7D are schematic cross-sectional views for explaining a method of manufacturing an optical receiver module according to a seventh embodiment of the present invention.

FIGS. 7A through 7D are schematic cross-sectional views for explaining a method of manufacturing an optical receive module according to the seventh embodiment of the present invention. Referring to FIG. 7A, a V-shaped guide groove 130 is formed in a silicon substrate 100. The V-shaped guide groove 130 is formed at an angle of about 70.5° according to a method known in the optical communication field.

Figure 7B:
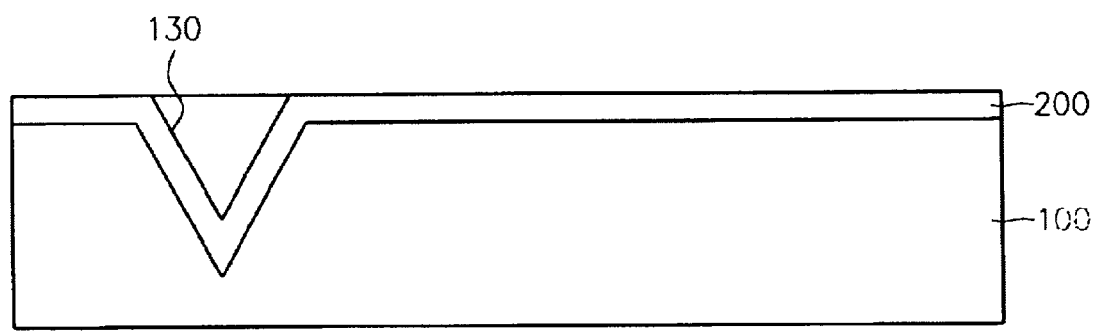

Referring to FIG. 7B, a porous silicon layer is formed on the entire surface of the silicon substrate 100 by anodising the front surface of the silicon substrate 100. In other words, silicon of the front surface of the silicon substrate 100 is changed into a porous silicon layer to a predetermined depth. Next, the front surface of the silicon substrate 100 is oxidized. Thus, the porous silicon layer is changed into an oxidized porous silicon layer 200. Since oxygen penetrates into the porous silicon layer easier than a general silicon layer, the oxidized porous silicon layer 200 may be formed to a very thick thickness, e.g., to a thickness of about several tens of micrometers.

Figure 7C:
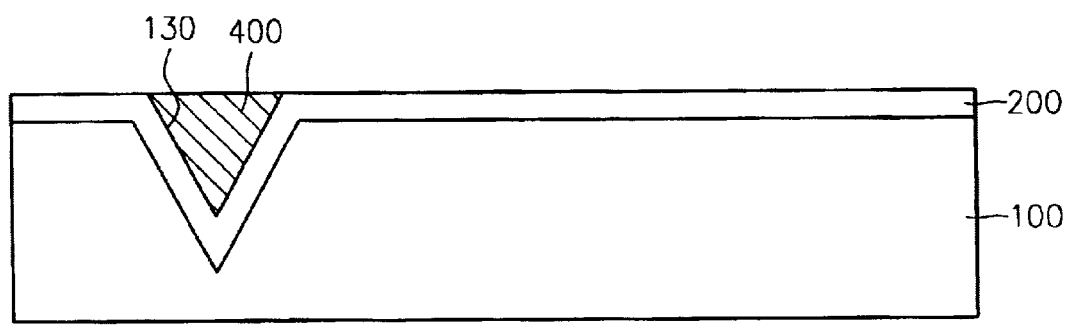

Referring to FIG. 7C, a mirror 400 is formed on the slope at the end of the V-shaped guide groove 130. The mirror 400 may be a metal mirror formed of a metal layer. The mirror 400 serves to change a path of light incident from the optical fiber 300, shown in FIG. 1, which may be placed in the v-shaped guide groove 130, so that the light is incident on the photo detector 510 shown in FIG. 1.

Figure 7D:
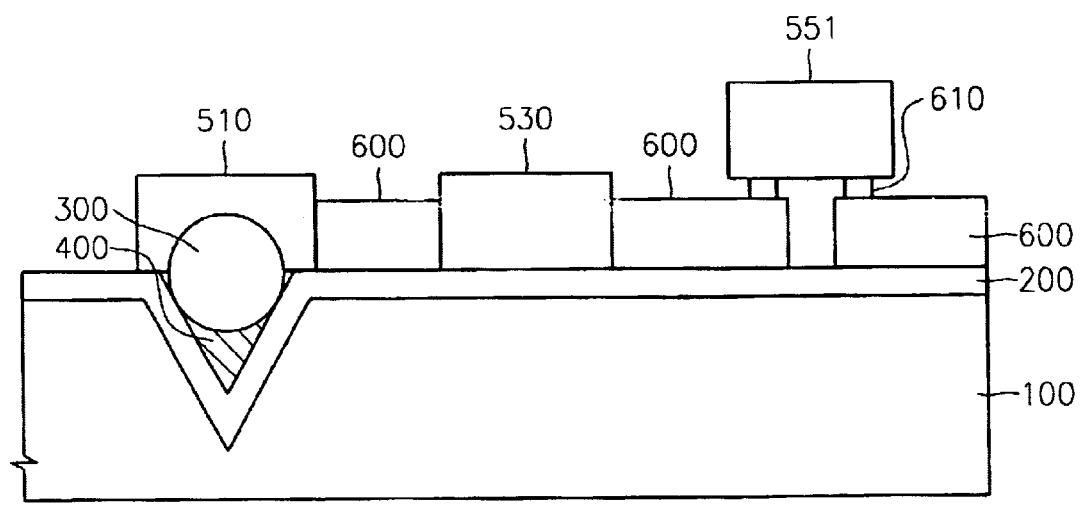

Referring to FIG. 7D, elements constituting the optical receiver module, e.g., a photo detector 510, a TIA 530, and a VCO 551, and a signal transmission line 600 for interconnecting the elements are formed on the oxidized porous silicon layer 200.

Some of the elements, e.g., the VCO 551, may be manufactured as a separate chip and connected to the signal transmission line 600 according to a flip chip bonding method using a solder bumper or a solder ball.

Eighth Embodiment

In the eighth embodiment, a process of manufacturing an optical receiver module according to another embodiment of the present invention will be described. The same elements of the seventh embodiment as those of the seventh embodiment may be assigned the same reference numerals as those of the first or seventh embodiment.

Figure 8A:
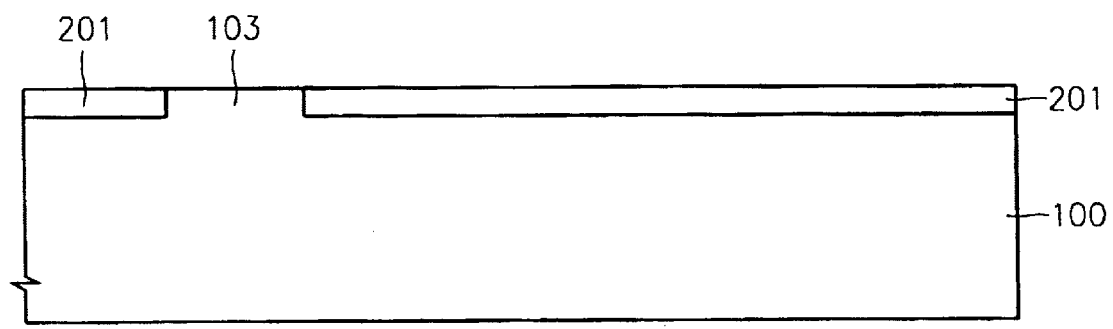
FIGS. 8A through 8D are schematic cross-sectional vies for explaining a method of manufacturing an optical receiver module according to an eighth embodiment of the present invention.

FIGS. 8A through 8D are schematic cross-sectional views for explaining a method of manufacturing an optical receiver module according to the eighth embodiment of the present invention. Referring to FIG. 8A, the front surface of a silicon substrate 100 is selectively anodised to selectively form a porous silicon layer on the silicon substrate 100. The selective formation of the porous silicon layer is achieved by forming a mask (not shown) for selectively covering a portion of the surface of the silicon substrate 100 and selectively anodising the uncovered portion of the surface of the silicon substrate 100. The mask may be a silicon nitride layer. Thereafter, the front surface of the silicon substrate 100 is oxidized. Thus, since oxygen penetrates into the porous silicon layer easier than a general silicon layer, an oxidized porous silicon layer 200 may be selectively formed to a quite thick thickness, e.g., to a thickness of several tens of micrometers.

Figure 8B:
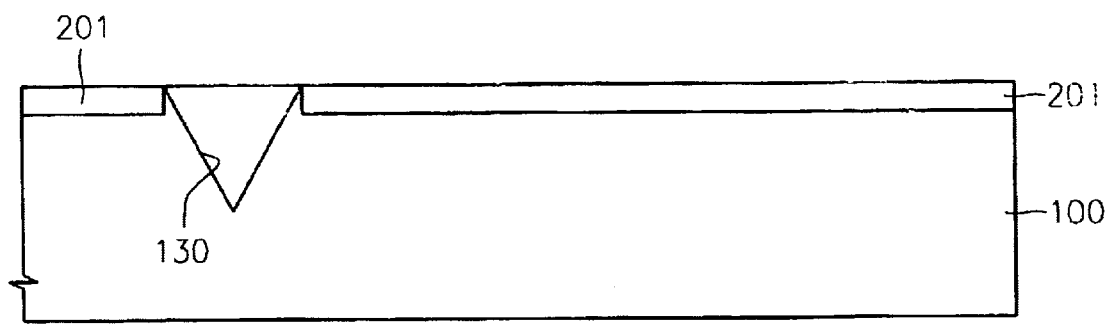

The V-shaped guide groove 130 shown in FIG. 7A may be formed in an area 103 in which the oxidized porous silicon layer 201 is not formed Referring to FIG. 8B, a V-shaped guide groove 130 is formed in the area 103 in which the oxidized porous silicon layer 201 is not formed. The V-shaped guide groove 130 is formed at an angle of about 70.5° using a method known in the optical communication section.

Figure 8C:
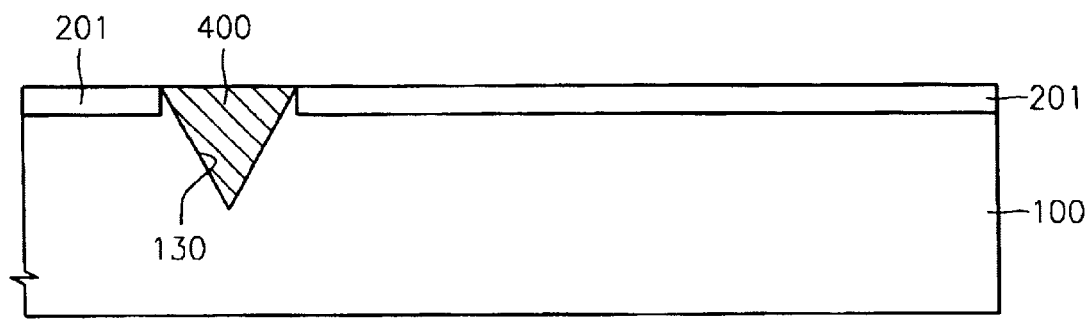

Referring to FIG. 8C, a mirror 400 is formed on the slope at the end of the V-shaped guide groove 130. The mirror 400 may be a metal mirror formed of a metal layer. The mirror 400 serves to change a path of light incident from the optical fiber 300, shown in FIG. 7D, which may be placed in the v-shaped guide groove 130, so that the light is incident on the photo detector 510 shown in FIG. 7D.

Figure 8D:
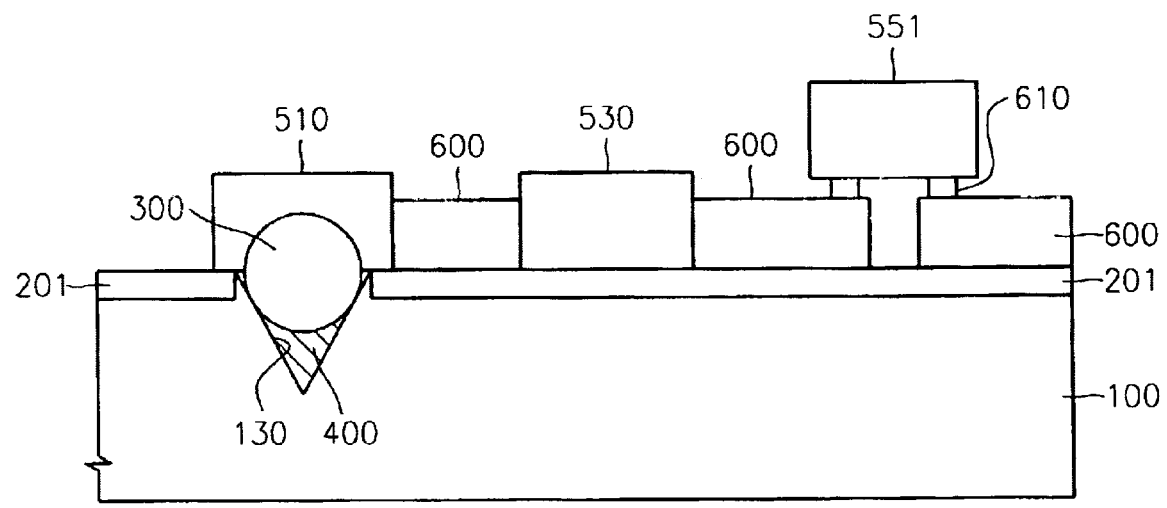

Referring to FIG. 8D, elements constituting the optical receiver module, e.g., a photo detector 510, a TIA 530, and a VCO 551, and a signal transmission line 600 for interconnecting the elements are formed on the oxidized porous silicon layer 201.

Some of the elements, e.g., the VCO 551, may be manufactured as a separate chip and connected to the signal transmission line according to a flip chip bonding method using a solder bumper or a solder ball.

Ninth Embodiment

The ninth embodiment proposes an optical receiver module system, according to an embodiment of the present invention, in which an optical receiver module as described above is integrated on a circuit board. The same elements of the ninth embodiment as those of the first embodiment may be assigned the same reference numerals as those of the first embodiment.

FIG. 9 is a schematic cross-sectional view of an optical module system in which an optical receiver module 710 according to the ninth embodiment of the present invention is integrated on a circuit board 700. Referring to FIG. 9, the optical module 710 realized as described above is integrated on the circuit board 700. The circuit board 700 may be a printed circuit board (PCB) or a FR-4. The electrical connection between the optical receiver module 710 and the circuit board 700 is accomplished by a bonding wire 900. For this, a first conductive pad 831 used as an input/output (I/O) pad for inputting/outputting a signal is formed on a silicon substrate 100 or an oxidized porous silicon layer 200 of the optical receiver module 710. A second conductive pad 837 used as an I/O pad is formed on the circuit board 700. The bonding wire 900 electrically connects the first conductive pad 831 and the second conductive pad 837 so as to electrically connect the circuit board 700 and the optical receiver module 710.

An active circuit 750 may be integrated on the circuit board 700. The active circuit 750 includes electronic devices, such as active devices 810, e.g., transistors, formed on a compound semiconductor substrate 800 such as GaAs or the like, e.g., transistors. The active circuit 750 is connected to the circuit board 700 via the boding wire 900 and also to the optical receiver module via the bonding wire 900. For this, a third conductive pad 835 used as an I/O pad is formed on the compound semiconductor substrate 800 of the active circuit 750.

As described above, the optical receiver module 710 and the active circuit 750 can be integrated together on the circuit board 700 to realize an optical receiver module system.

Tenth Embodiment

In the tenth embodiment, an optical receiver module system, according to another embodiment of the present invention, in which an optical receiver module is integrated on a circuit board. The same elements of the tenth embodiment as those of the ninth embodiment may be assigned the same reference numerals as those of the ninth embodiment.

Figure 10:
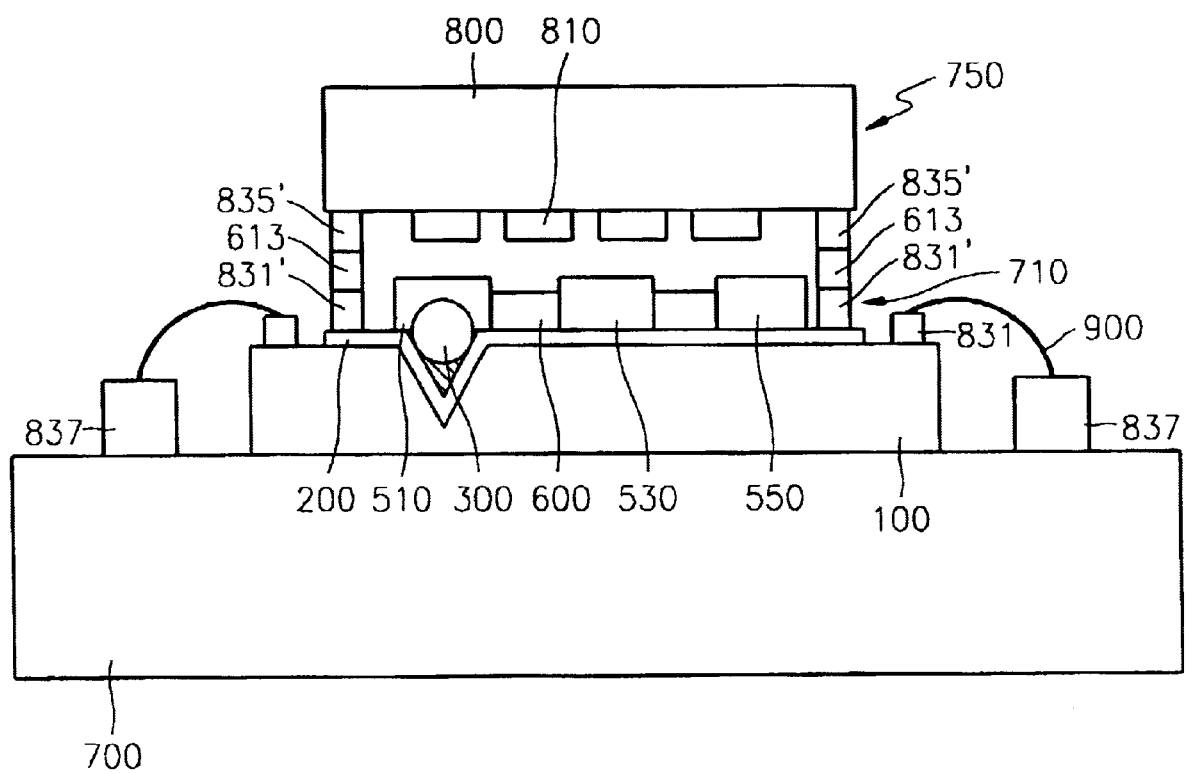
FIG. 10 is a schematic cross-sectional view for explaining an optical receiver module system in which an optical receiver module according to a tenth embodiment of the present invention is integrated on a circuit board.

FIG. 10 is a schematic cross-sectional view of an optical receiver module system in which an optical receiver module 710 according to the tenth embodiment of the present invention is integrated on a circuit board 700. Referring to FIG. 10, the optical receiver module 710 is electrically connected to an active circuit 750 using a flip chip bonding method. For example, a third conductive pad 835' used as an I/O pad is formed on a compound semiconductor substrate 800 of the active circuit 750. Next, a fourth conductive pad 831' used as an I/O pad is formed on an oxidized porous silicon layer 200 or a silicon substrate 100 of the optical receiver module 710. Thereafter, the third conductive pad 835' and the fourth conductive pad 831' are electrically interconnected via a second connector 613 such as a solder bumper or a solder ball. Here, the active circuit 750 is reversed and bonded over the optical receiver module 710 using a flip chip bonding method, so that electronic devices 810 of the active circuit 750 face elements of 510, 530, and 550 of the optical receiver module 710.

The optical receiver module 710 is integrated on the circuit board 700 and the first conductive pad 831 on the silicon substrate 100 of the optical receiver module 710 and the second conductive pad 837 on the circuit board 700 are electrically connected. As a result, the circuit board 700 and the optical receiver module 710 are electrically connected via a bonding wire 900.

Eleventh Embodiment

The eleventh embodiment suggests an optical receiver module system, according to another embodiment of the present invention, in which an optical receiver module is integrated on a circuit board. The same elements of the eleventh embodiment as those of the tenth embodiment may be assigned the same reference numerals as those of the tenth embodiment.

Figure 11:
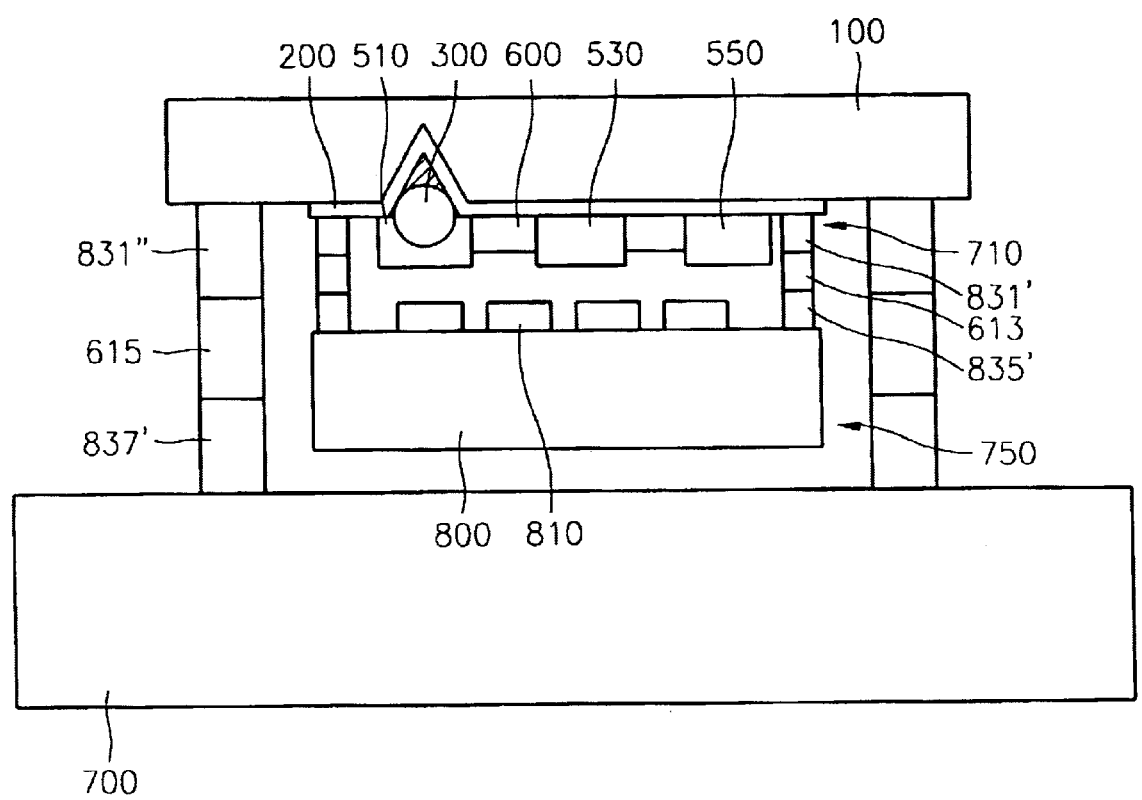
FIG. 11 is a schematic cross-sectional view for explaining an optical receiver module system in which an optical receiver module according to an eleventh embodiment of the present invention is integrated on a circuit board.

FIG. 11 is a schematic cross-sectional view of an optical receiver module system in which an optical receiver module 710 according to the eleventh embodiment of the present invention is integrated on a circuit board 700. Referring to FIG. 11, the optical receive module 710 is electrically connected to an active circuit 750 using a flip chip bonding method. For example, a third conductive pad 835' used as an I/O pad is formed on a compound semiconductor substrate 800 of the active circuit 750. Next, a fourth conductive pad 831' used as an I/O pad is formed on an oxidized porous silicon layer 200 or a silicon substrate 100 of the optical receiver module 710. Thereafter, the third conductive pad 835' and the fourth conductive pad 831' are electrically interconnected via a second connector 613 such as a solder bumper or a solder ball. Here, the active circuit 750 is reversed and bonded over the optical receiver module 710 using a flip chip bonding method, so that electronic devices 810 of the active circuit 750 face elements of 510, 530, and 550 of the optical receiver module 710.

The active circuit 750 electrically connects the optical receiver module 710 and the circuit board 700 using a flip chip bonding method. In other words, a fifth conductive pad 831', used as an I/O pad, formed on the silicon substrate 100 of the optical receiver module 710 are connected to a sixth conductive pad 837' formed on the circuit board 700 via a third connector 615 such as a solder bumper or a solder ball. As a result, the optical receiver module 710 is integrated on the circuit board 700.

Twelfth Embodiment

The twelfth embodiment presents an optical transmitter module according to an embodiment of the present invention.

Figure 12A:
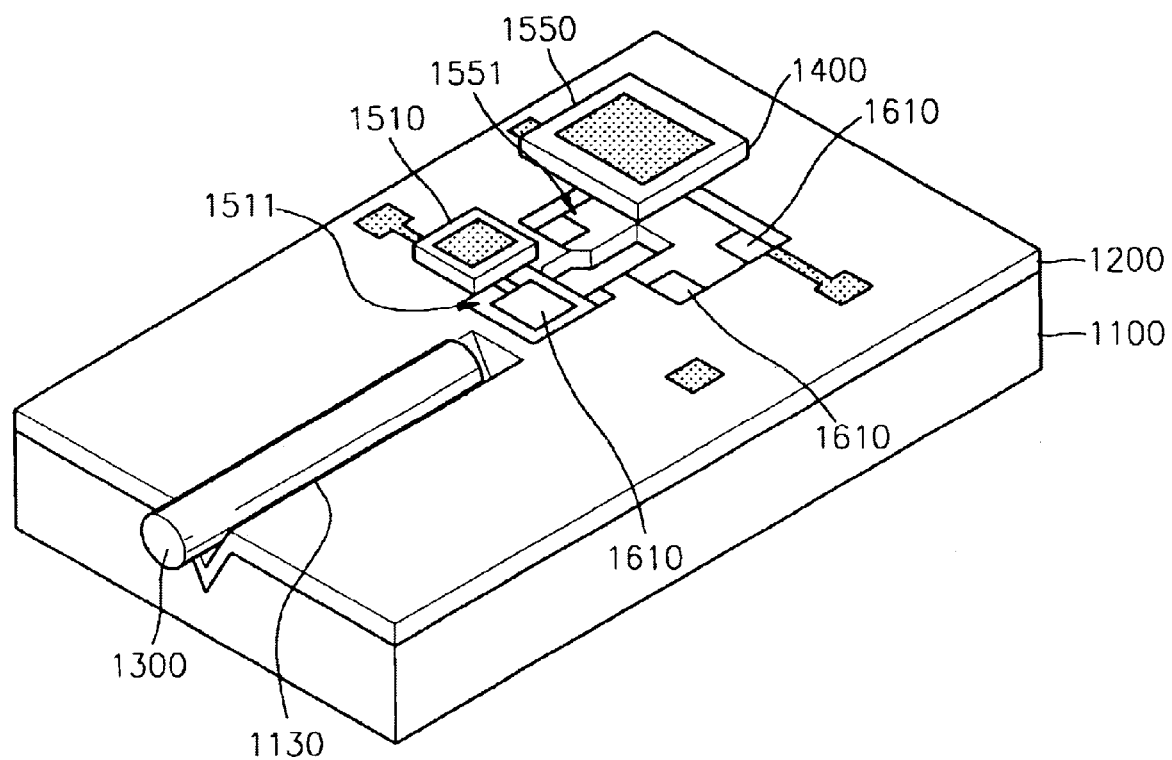
FIGS. 12A through 12C are schematic views for explaining an optical receiver module according to a twelfth embodiment of the present invention.
Figure 12B:
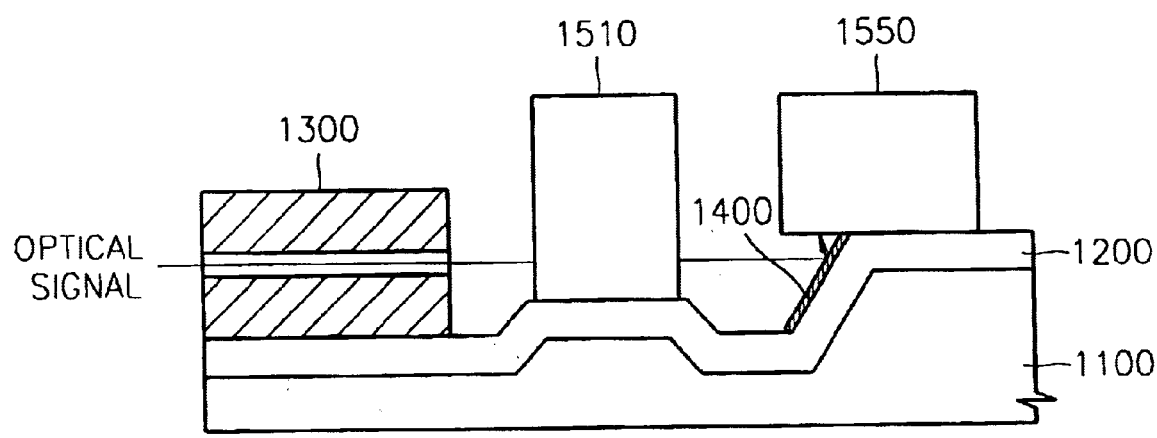
Figure 12C:
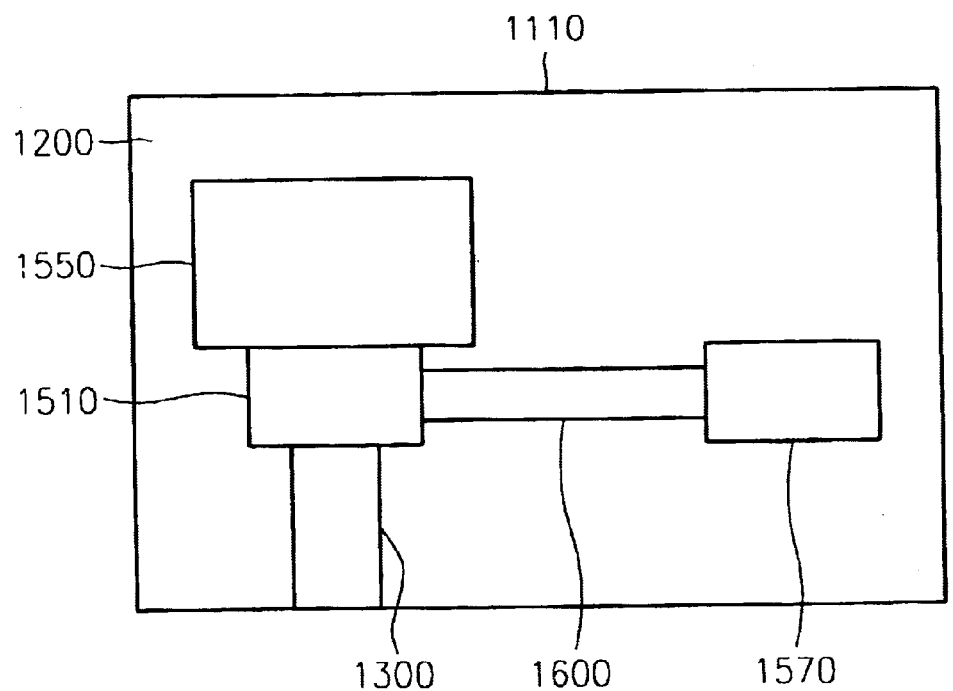

FIGS. 12A through 12C are schematic vies for explaining an optical transmitter module according to the twelfth embodiment of the present invention.

FIG. 12A is a schematic perspective view of the optical transmitter module according to the twelfth embodiment of the present invention, FIG. 12B is a schematic cross-sectional view for illustrating a process of transmitting light via the optical transmitter module shown in FIG. 12A, and FIG. 12C is a schematic plan view of the optical transmitter module shown in FIG. 12A.

Referring to FIGS. 12A through 12C, in the optical transmitter module according to the twelfth embodiment of the present invention, various types of elements for transmitting an optical signal, e.g., a laser diode 1510 and a monitoring passive device 1550, are integrated on a silicon substrate 1100, e.g., a $p^+$ type conductive silicon substrate. A driver amplifier 1570 is electrically connected to the laser diode 1510 via a signal transmission line 1600. In order to integrate the elements on the silicon substrate 1100, as shown in FIG. 12A, a laser diode site 1511, a monitoring passive site 1551, and solders 1610 are formed on the silicon substrate 1100. The solders may be Au-Su solders.

In order to form a path through which light emitted from the laser diode 1510 is transmitted, an optical fiber 1300 is introduced. The optical fiber 1300 is arranged with the laser diode 1510 via a V-shaped guide groove 1130 formed in the silicon substrate 1100. A portion of light emitted from the laser diode 1510 is delivered to the monitoring passive device 1550 behind the laser diode 1510 and then monitored by the monitoring passive device 1550. Here, as shown in FIG. 12B, a metal mirror 1400 is installed underneath the monitoring passive device 1550 to change a path of an optical signal so that the optical signal is incident on the monitoring passive device 1550.

An oxidized porous silicon layer 1200 as previously described is thickly formed between the elements, i.e., the laser diode 1510, the monitoring passive device 1550, the driver amplifier 1570 for driving the laser diode 1510, and the silicon substrate 1100. As previously described, the oxidized porous silicon layer 1200 may be selectively formed on the silicon substrate 1100. Alternatively, a separate inter-dielectric insulating layer, e.g., a silicon nitride layer, may be further formed on the thick oxidized porous silicon layer 1200.

The oxidized porous silicon layer 1200 may be formed to an enough thickness to prevent signal loss, e.g., a thickness of several tens of micrometers. Thus, the oxidized silicon layer 1200 can contribute to minimizing signal loss when transmitting an optical signal in a high frequency band in an optical transmitter module.

Thirteenth Embodiment

The thirteenth embodiment suggests an optical repeater module according to an embodiment of the present invention.

Figure 13:
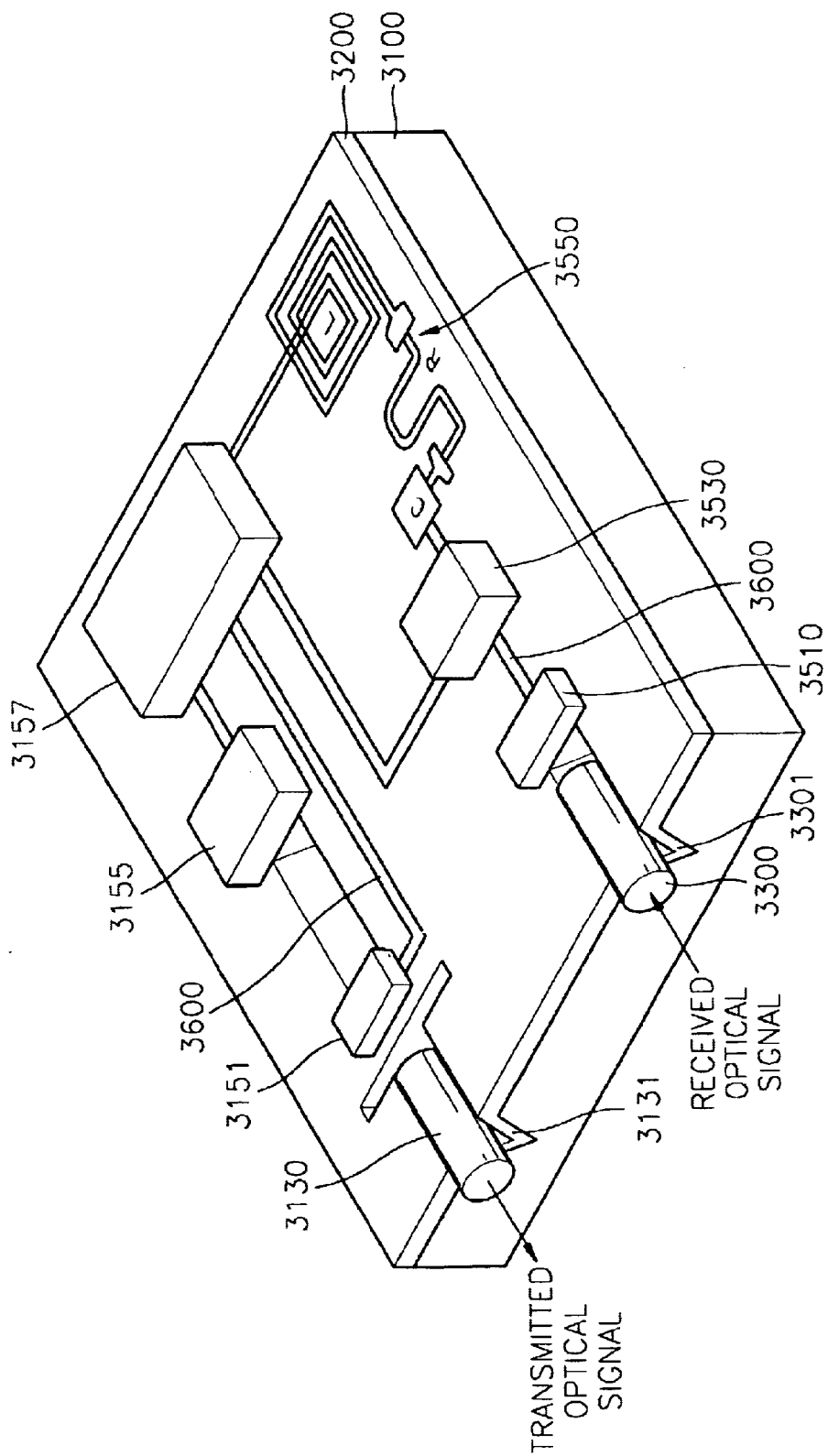
FIG. 13 is a schematic perspective view for explaining an optical repeater module according to a thirteenth embodiment of the present invention.

FIG. 13 is a schematic perspective view of an optical repeater module according to the thirteenth embodiment of the present invention. Referring to FIG. 13, the optical repeater module according to the thirteenth embodiment is constituted by combining an optical signal receiver for receiving an optical signal and an optical signal transmitter for transmitting an optical signal on a silicon substrate 3100, e.g., a p⁺ type conductive silicon substrate.

In the optical signal receiver, various types of elements for receiving an optical signal, e.g., a photo detector 3510, a current-voltage converter, e.g., a TIA 3530, and a signal generator, e.g., a VCO 3550, are integrated on the p⁺ type conductive silicon substrate 3100. As shown in FIG. 13, the elements are interconnected via a signal transmission line 3600. The photo detector 3510 serves to receive an optical signal incident on the optical repeater module via a first optical fiber 3300 and convert the optical signal into a current signal. In order that the first optical fiber 3300 transmits the optical signal to the photo detector 3510, a first guide groove 3301 in which the first optical fiber 3300 is installed is formed in the surface of the silicon substrate 3100. The first guide groove 3301 is V-shaped and at an angle of about 70.52°.

As described above, the first optical fiber 3300, which is introduced in an optical signal receiver, i.e., an optical receiver module, via the first guide groove 3301, transmits the optical signal to the photo detector 3510. For this, as presented in FIG. 13, a first mirror (not shown) is slantingly formed at the end of the first guide groove 3301. The first mirror serves to change a path of the optical signal so that the optical signal incident on the first mirror through the first optical fiber 3300 is incident on the photo detector 3510.

The photo detector 3510 converts the optical signal into a current signal. In other words, the photo detector 3510 receives an optical signal and generates current. As shown in FIG. 13, the current signal is delivered to the TIA 3530, and the TIA 3530 amplifies the current signal to a voltage signal. The voltage signal generated by the TIA 3530 is transmitted to the VCO 3550, which is composed of a condenser C, a resistor R, and an inductor L, through the signal transmission line 3600. The VCO 3550 generates a signal.

The signal generated by the VCO 3550 and the TIA 3530 is transmitted to the optical signal transmitter for transmitting an optical signal, and the optical signal transmitter transmits an optical signal based on the received voltage signal. For this, the optical signal transmitter is constituted by integrating various types of elements, e.g., a laser diode 3151, a monitoring passive device 3155, and a laser diode driving and controlling unit 3157 for driving and controlling the laser diode 3151 and the monitoring passive device 3155, on the silicon substrate 3100.

In order to form a path through which an optical signal emitted from the laser diode 3151 is transmitted, a second optical fiber 3130 is installed. The second optical fiber 3130 is arranged with the laser diode 3151 via a V-shaped second guide groove 3131 formed in the silicon substrate 3100. A portion of the optical signal emitted from the laser diode 3151 is transmitted to the monitoring passive device 3155 behind the laser diode 3151 and then monitored by the monitoring passive device 3155. Here, a second mirror (not shown) formed of a metal layer is installed underneath the monitoring passive device 3155 to change of the path of the optical signal so that the optical signal is incident on the monitoring passive device 3155.

An oxidized porous silicon layer 3200 is formed to a thick thickness between the elements for receiving and transmitting an optical signal, e.g., the laser diode 3151, the monitoring passive device 3155, the laser diode driving and controlling unit 3157, the photo detector 3510, and the TIA 3530, the VOC 3550 and the silicon substrate 3100. As described previously, the oxidized porous silicon layer 3200 may be selectively on the silicon substrate 3100. Alternatively, an additional inter-dielectric insulating layer, e.g., a silicon nitride layer, may be further formed on the oxidized porous silicon layer 3200.

The oxidized porous silicon layer 3200 may be formed to an enough thickness to prevent signal loss, e.g., to a thickness of about several tens of micrometers. Thus, the oxidized porous silicon layer can contribute to minimizing signal loss when transmitting an optical signal in a high frequency band in an optical repeater module.

As described above, according to the present invention, an oxidized porous silicon layer can be formed between devices for processing an optical signal input or output via an optical fiber and a silicon substrate. Thus, in a case where an optical signal in a high frequency band is received or transmitted, signal loss can be minimized. Also, the oxidized porous silicon layer can be formed to a very thick thickness, e.g., to a thickness of several tens of micrometers, on the silicon substrate. Therefore, signal loss of the optical signal can be minimized. As a result, it is possible to employ a silicon substrate to constitute an optical module using an optical signal in a high frequency band. Thus, an optical module can be manufactured at a lower cost.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An optical receiver module system used in a high-frequency optical communication system, the optical receiver module system comprising:

a circuit board;

a silicon substrate that is placed on and electrically connected to the circuit board and in which a V-shaped guide groove for arranging an optical fiber is formed;

the optical fiber that is installed in the V-shaped guide groove and used as a path through which an optical signal is input;

an oxidized porous silicon layer that is formed on the silicon substrate to prevent signal loss;

a photo detector that is installed on the oxidized porous silicon layer, receives the optical signal input via the optical fiber, and converts the optical signal into a current signal;

a current-voltage converter that is installed on the oxidized porous silicon layer and converts the current signal into a voltage signal;

a signal oscillator that is installed on the oxidized porous silicon layer and generates a signal from the voltage signal;

an optical receiver module that includes a signal transmission line for electrically connecting the photo detector, the current-voltage converter, and the signal oscillator; and an active circuit that is electrically connected to the circuit board and the optical receiver module;

wherein the active circuit and the optical receiver module are electrically connected using a flip chip bonding method; and wherein the optical receiver module flip-chip-bonded to the active circuit is electrically connected to the circuit board using a flip chip bonding method.

2. The optical receiver module system of claim 1, further comprising an inter-layered insulating layer that is formed on the oxidized porous silicon layer.

* * * * *